United States Patent [19]

France et al.

[11] Patent Number: 4,684,826
[45] Date of Patent: Aug. 4, 1987

[54] PROGRAMMABLE ASYNCHRONOUS REGISTER INITIALIZATION CIRCUIT

[75] Inventors: Michael G. France, Newark; George L. Geannopoulos, San Jose; Robert J. Bosnyak, Mt. View; Steve Y. Chan, San Jose, all of Calif.

[73] Assignee: Monolithic Memories, Inc., Santa Clara, Calif.

[21] Appl. No.: 633,164

[22] Filed: Jul. 20, 1984

[51] Int. Cl.[4] .................. H03K 19/20; H03K 19/084; G06F 7/38; G11C 19/00
[52] U.S. Cl. ................. 307/272 A; 307/445; 307/458; 307/466; 365/95; 377/77
[58] Field of Search ............ 307/200 A, 272 A, 202.1, 307/457, 454, 465–466, 592, 443, 445, 458; 365/95, 226; 377/70, 73, 75, 77

[56] References Cited

U.S. PATENT DOCUMENTS

| | | | |
|---|---|---|---|
| 3,609,569 | 7/1970 | Todd | 307/272 A |
| 4,277,698 | 7/1981 | Vasquez | 307/272 A |
| 4,446,534 | 5/1984 | Smith | 307/465 |

FOREIGN PATENT DOCUMENTS 0079530  6/1981  Japan .................. 307/457

*Primary Examiner*—Stanley D. Miller
*Assistant Examiner*—M. R. Wambach
*Attorney, Agent, or Firm*—Alan H. MacPherson; Nathan N. Kallman; Paul J. Winters

[57] ABSTRACT

A circuit constructed in accordance with this invention includes means for asynchronously forcing a flip-flop (70) or a register to a programmable logical state in response to an initialization input signal ($\bar{I}$). In one embodiment, a D-type flip-flop (70) is provided having data input terminal (71), a clock input terminal (77), a data output terminal (103), an initialization input terminal (41), and a programming input terminal (11). When an initialization input signal $\bar{I}$ is received, a predefined output signal is immediately placed on the data output terminal (103). The predefined output signal is defined by the status of a fuse (13), which is opened, if desired, via the programming input terminal (11). When an initialization input signal is not received, the flip-flop (70) operates as a normal D-type flip-flop.

12 Claims, 5 Drawing Figures

PROGRAMMABLE ASYNCHRONOUS REGISTER INITIALIZATION CIRCUIT

BACKGROUND OF THE INVENTION

This invention relates to means for forcing a storage device to a selected logical state. This is useful for, among other things, quickly placing a predetermined word in the output registers of memory circuitry.

In the operation of certain microprocessor based digital circuitry, it is sometimes necessary to have the capability to force certain registers to selected values regardless of the stage of operation of the circuit. This capability is useful, for example, upon system start-up, restarting the system after power interruptions, and user initiated reinitialization of the computer system.

A circuit commonly used as a register is the D-type flip-flop or bistable multivibrator. A D-type flip-flop receives a data input signal and provides the equivalent of that input signal on an output terminal, and provides this output signal until a new data input signal is stored during a subsequent clock period. FIG. 1 is a schematic diagram of a prior art master-slave D-type flip-flop 30 which includes an initialize function. Master flip-flop 10 receives input signal D from input terminal 71 when the clock input signal CLK on clock input terminal 77 is a logical 0 (approximately 0 volts). The emitters of transistors 79 and 80 are connected to clock input terminal 77. The highest voltage level possible on the bases of transistors 79 and 80 is a logical 1 (approximately 5 volts). Therefore, when clock input signal CLK is a logical 1, transistors 79 and 80 are not forward biased. When clock input signal CLK is a logical 0, transistors 79 and 80 turn on if bias is provided to the bases of transistors 79 and 80, respectively.

A logical 1 input signal D on input terminal 71 is inverted once by NPN transistor 69, thus providing a logical 0 on the collector of transistor 69. This logical 0 on the collector of transistor 69 is applied to the base of NPN transistor 74, thus providing a logical 1 on the collector of transistor 74. The logical 0 on the collector of transistor 69 causes current to flow from positive voltage source V20, through resistor 82, base-emitter junction 78-2, diode 75, and transistor 69 to ground (approximately 0 volts). Because transistor 74 is off, no current flows from positive voltage source V20, through resistor 83, base-emitter junction 81-2, diode 76, and transistor 74 to ground. Because base-emitter junction 78-2 is forward biased, the collector of transistor 78 is pulled low, and thus the base of transistor 79 is low, thereby keeping transistor 79 off. Therefore, bias is not provided to the base of transistor 79 and transistor 79 is off even when clock signal CLK applied to clock input terminal 77 is a logical 0. Base-emitter junction 81-2 is not forward biased because transistor 74 is off. Base-emitter junction 81-1 is not forward biased because transistor 79 is off. Therefore, when clock signal CLK applied to clock input terminal 77 is a logical 0, current flows from positive voltage source V20, through resistor 83, the base-collector junction of transistor 81, and the base-emitter junction of transistor 80 to clock input terminal 77. Therefore, transistor 80 is on when clock signal CLK applied to clock input terminal 77 is a logical 0 and input signal D is a logical 1.

When transistor 80 is on, current flows from positive voltage source V20 through resistor 87, the base-emitter junction of NPN transistor 86, and transistor 80 to clock input terminal 77. Therefore, transistor 86 is on and the collector of transistor 86 provides a logical 0 to the base of transistor 85, thereby causing transistor 85 to be turned off. Furthermore, because transistor 79 is off, no current flows from positive voltage source V20, through resistor 88, and the base-emitter junction of transistor 89. Therefore, current flows from positive voltage source V20 through resistor 88, the base-collector junction of transistor 89, the base-emitter junction of transistor 90, and resistor 92 to ground. The voltage drop thus developed across resistor 92 forward biases transistor 93, thereby turning on transistor 93. With transistor 93 turned on, the base of transistor 99 is pulled to a logical 0, thereby turning off transistor 99. With transistor 99 turned off, output terminal 103 is pulled up by resistor 100, thereby providing a logical 1 output signa $D_{out}$ on output terminal 103. Furthermore, with transistor 93 turned on, the logical 0 signal on the collector of transistor 93 is applied via forward biased diode 96 to the base of transistor 85. Thus, transistor 85 is turned off, which in turn does not pull down the base of transistor 90. With the base of transistor 90 remaining a logical 1, the output signal $D_{out}$ remains a logical 1 even when clock input signal CLK switches to a logical 1.

Conversely, when a logical 0 input signal D is placed on input lead 71, transistor 79 is turned on and transistor 80 is turned off, when clock input signal CLK on clock input terminal 77 is a logical 0. Because transistor 79 is on, transistor 89 does not provide bias to transistor 90. Therefore, transistor 90 is off, transistor 93 is not forward biased, and thus transistor 93 is off. Because transistor 93 no longer pulls the base of transistor 99 to ground, transistor 99 is on. Therefore, the output signal $D_{out}$ on output node 103 is a logical 0. Because transistor 93 is off and because transistor 80 is off, transistor 85 is forward biased by transistor 86. When transistor 85 is on, the base of transistor 90 is a logical 0. Therefore, the output signa $D_{out}$ on output terminal 103 remains a logical 0 when clock input signal CLK switches to a logical 1, until the status of slave flip-flop 20 is altered by the master flip-flop 10 during the logical 0 cycle of clock input signal CLK applied to clock input terminal 77.

Transistor 105, diode 107, resistor 108, and initialization terminal 104 form an initialization input circuit. When a logical 1 initialization input signal I is placed on initialization input terminal 104, NPN transistor 105 is turned on and the collector of transistor 105 provides a logical 0 to the base of transistor 69 regardless of the status of input signal D, thereby forcing output signal $D_{out}$ on output terminal 103 to a logical 0 when clock signal CLK becomes a logical 0. However, it is desirable to have an initialization circuit which alters output signal $D_{out}$ asynchronously (i.e., without regard to the state of the clock signal CLK). The prior art circuit of FIG. 1 does not alter output signal $D_{out}$ until clock signal CLK applied to clock input terminal 77 becomes a logical 0. In addition, it is desirable to have the capability to program the asynchronous initilization circuit to programmally provide either a logical 1 output signal or a logical 0 output signal in response to an initialization input signal.

SUMMARY

A circuit constructed in accordance with this invention includes means for asynchronously forcing a flip-flop or a register to a programmable logical state in response to an initialization input signal. In one embodiment of this invention, a D-type flip-flop is provided having a data input terminal, a clock input terminal, a data output terminal, an initialization input terminal, and a programming input terminal. When an initialization input signal is received, a predefined output signal is immediately placed on the data output terminal, regardless of the status of the clock input signal or the status of the data input signal. The predefined output signal is defined by the status of a programming means, such as a fuse, which is opened, if desired, via the programming input terminal. When an initialization input signal is not received, the flip-flop operates as a normal D-type flip-flop.

DETAILED DESCRIPTION

Figure 2:
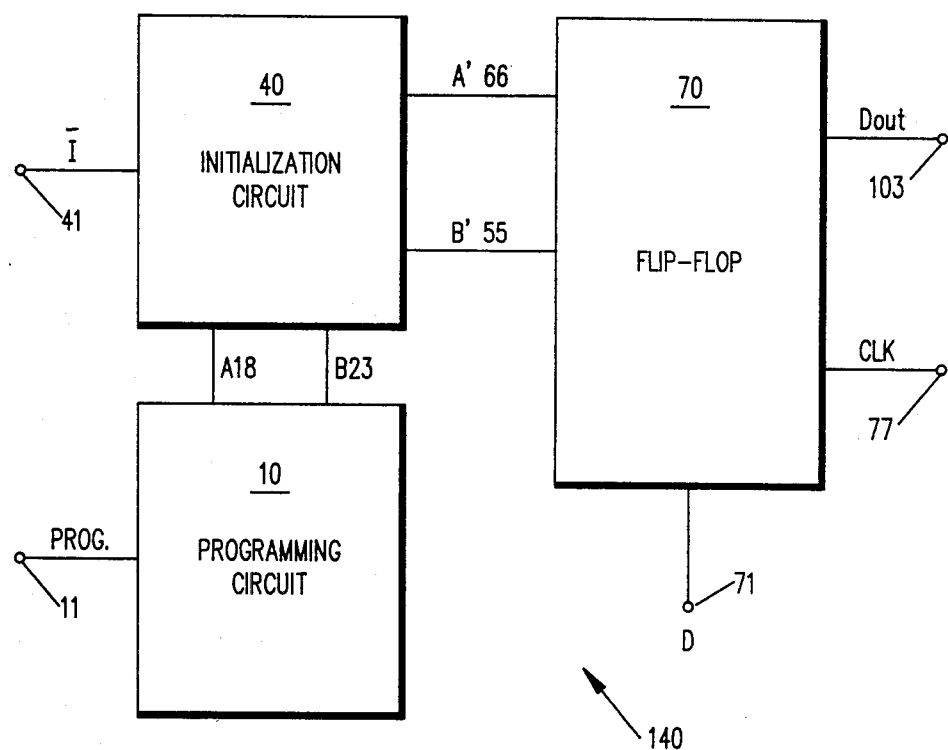
FIG. 2 is a block diagram of a circuit constructed in accordance with one embodiment of this invention.

FIG. 2 is a block diagram of one embodiment of the present invention. Programming circuit 10 provides complementary output signals A and B on leads 18 and 23, respectively. When a logical 1 is placed on programming input terminal 11, programming means contained within programming circuit 10 is altered, permanently forcing output signal A to a logical 1 and output signal B to a logical 0. When the programming terminal 11 remains at logical 0, the programming means is not altered, forcing output signal A to a logical 0 and output signal B to a logical 1. The use of a fusible link (such as fusible link 13 of programming circuit 10 in FIG. 3b) to program programming circuit 10 is described as an example only. Other means for programming circuit 10 will become readily apparent to those skilled in the art in light of the teachings of this invention.

Initialization circuit 40 accepts initialization input signal $\bar{I}$ on initialization input terminal 41. When initialization input signal $\bar{I}$ is a logical 1, initialization circuit 40 is disabled and output signals A' and B' on leads 66 and 55, respectively, are both logical 1. When initialization input signal $\bar{I}$ is a logical 0 and output signal A from circuit 10 is a logical 1 (and thus output signal B is a logical 0), initialization output signal A' is a logical 0 and output signal B' is a logical 1. When initialization input signal $\bar{I}$ is a logical 0 and output signal B from circuit 10 is a logical 1 (and thus output signal A is a logical 0), output signal B' is a logical 0 and output signal A' is a logical 1.

Circuit 70 is a master-slave D-type flip-flop. When output signals A' and B' from initialization circuit 40 are both logical 1, circuit 70 functions as a normal D-type flip-flop. When output signal A' is a logical 0 and output signal B' is a logical 1, output signal $D_{out}$ is immediately forced to a logical 0, regardless of the status of clock input signal CLK received on clock input terminal 77 and regardless of the status of data input signal D received on data input terminal 71. When output signal A' is a logical 1 and output signal B' is a logical 0, output signal $D_{out}$ is immediately forced to a logical 1, regardless of the status of clock input signal CLK and regardless of the status of data input signal D.

Figure 1:
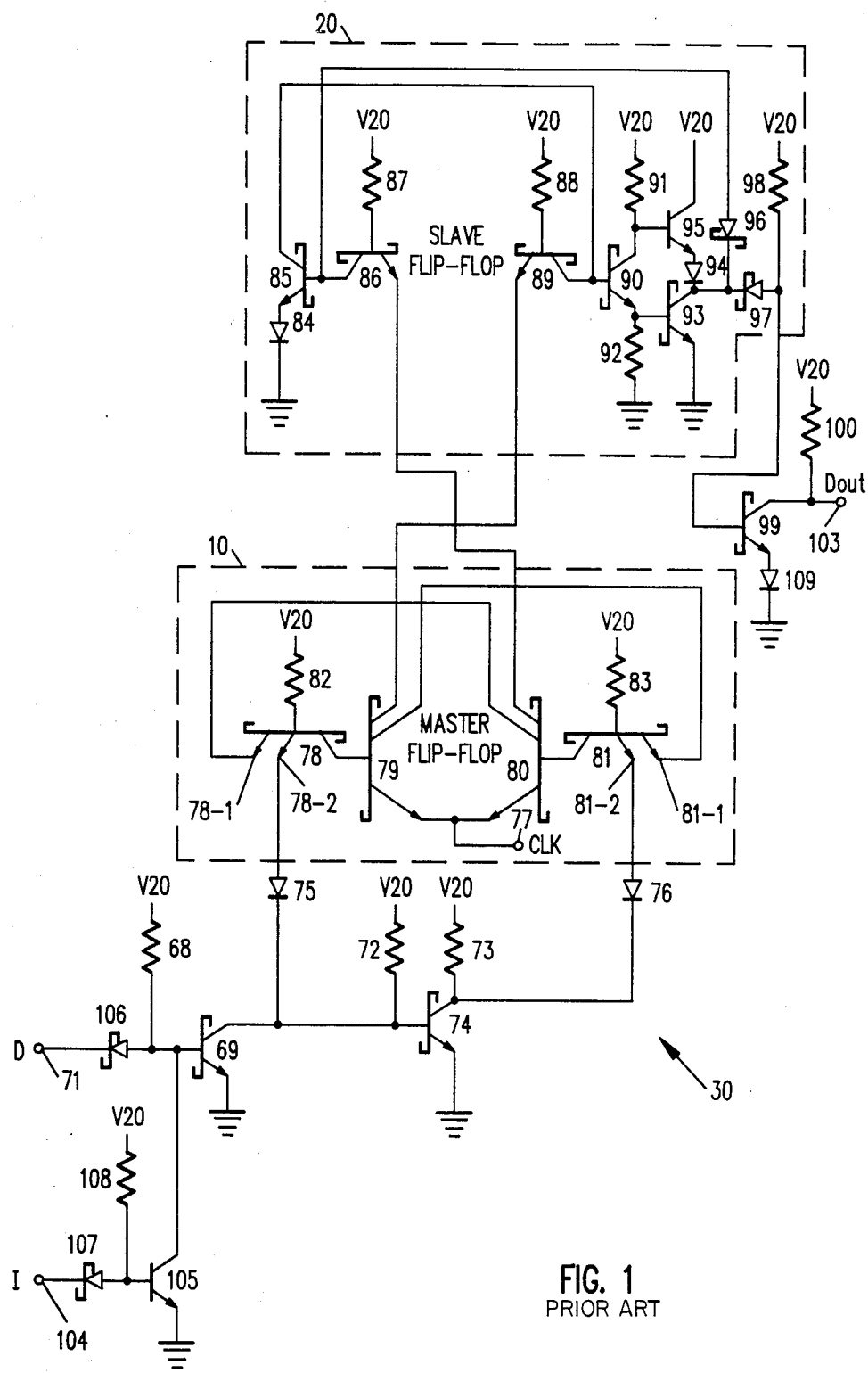
FIG. 1 is a schematic diagram of a prior art flip-flop with synchronous initialization circuitry.
Figure 3A:
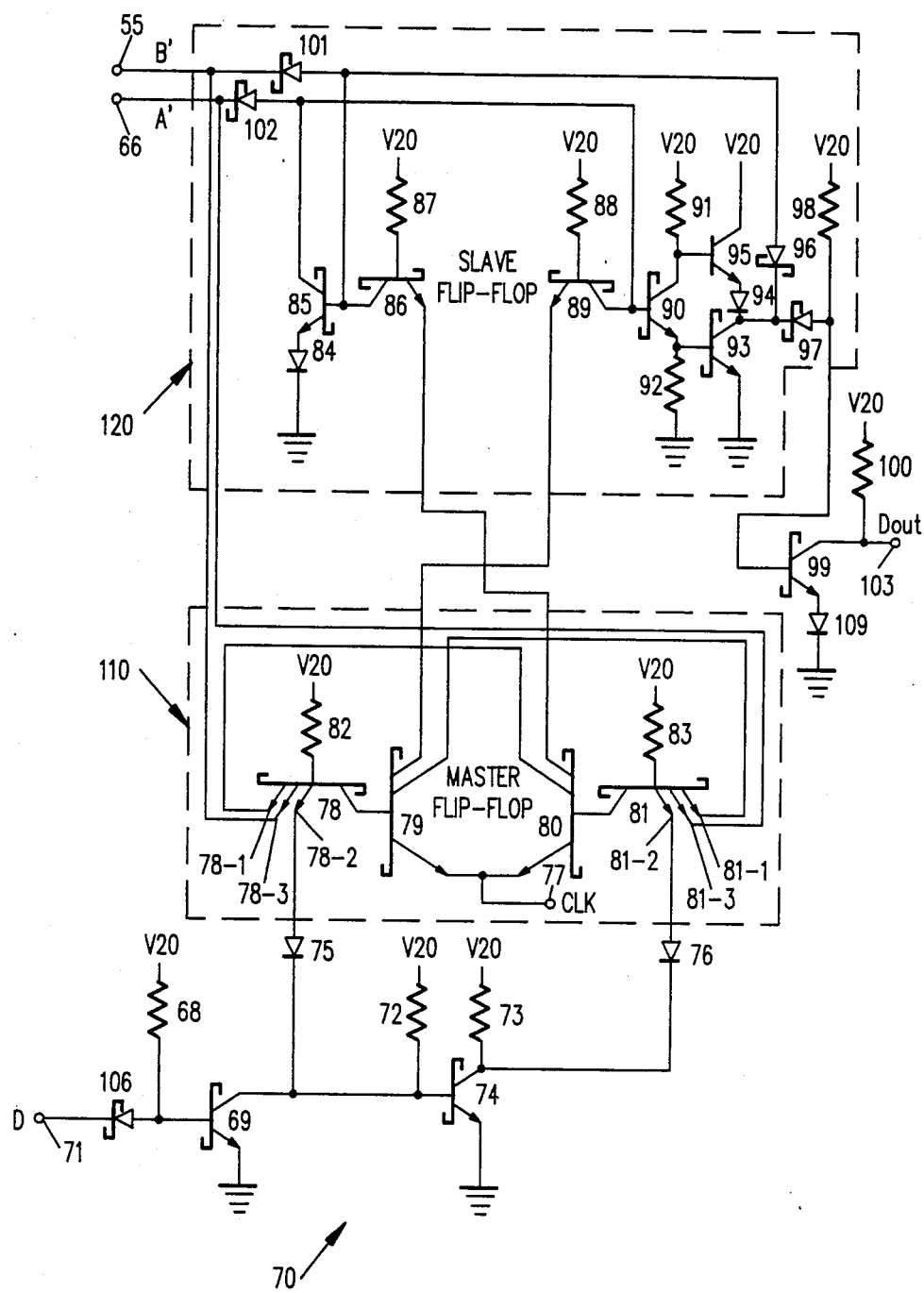
FIG. 3a is a schematic diagram of a flip-flop or single bit portion of a register which is constructed in accordance with one embodiment of this invention.

FIG. 3a is a schematic diagram of one embodiment of flip-flop 70 shown in FIG. 2. Flip-flop 70 of FIG. 3a operates in the same manner as flip-flop 30 in FIG. 1 except that flip-flop 70 in FIG. 3a includes base-emitter junctions 78-3 and 81-3, diodes 101 and 102, and input terminals 55 and 66. When input signals A' and B' received on input terminals 55 and 66, respectively, are both logical 1, diodes 101 and 102 and base-emitter junctions 78-3 and 81-3 are reverse biased and behave as open circuits, causing flip-flop 70 to function as a standard D type flip-flop in exactly the same manner as flip-flop 30 of FIG. 1. However, when a logical 0 initialization input signal $\bar{I}$ is received on input terminal 41 of initialization circuit 40 (FIGS. 2 and 3c), either input signal A' or B' is a logical 0, depending on the programmed state of programming circuit 10 (as explained below).

Figures 3B, 3C:
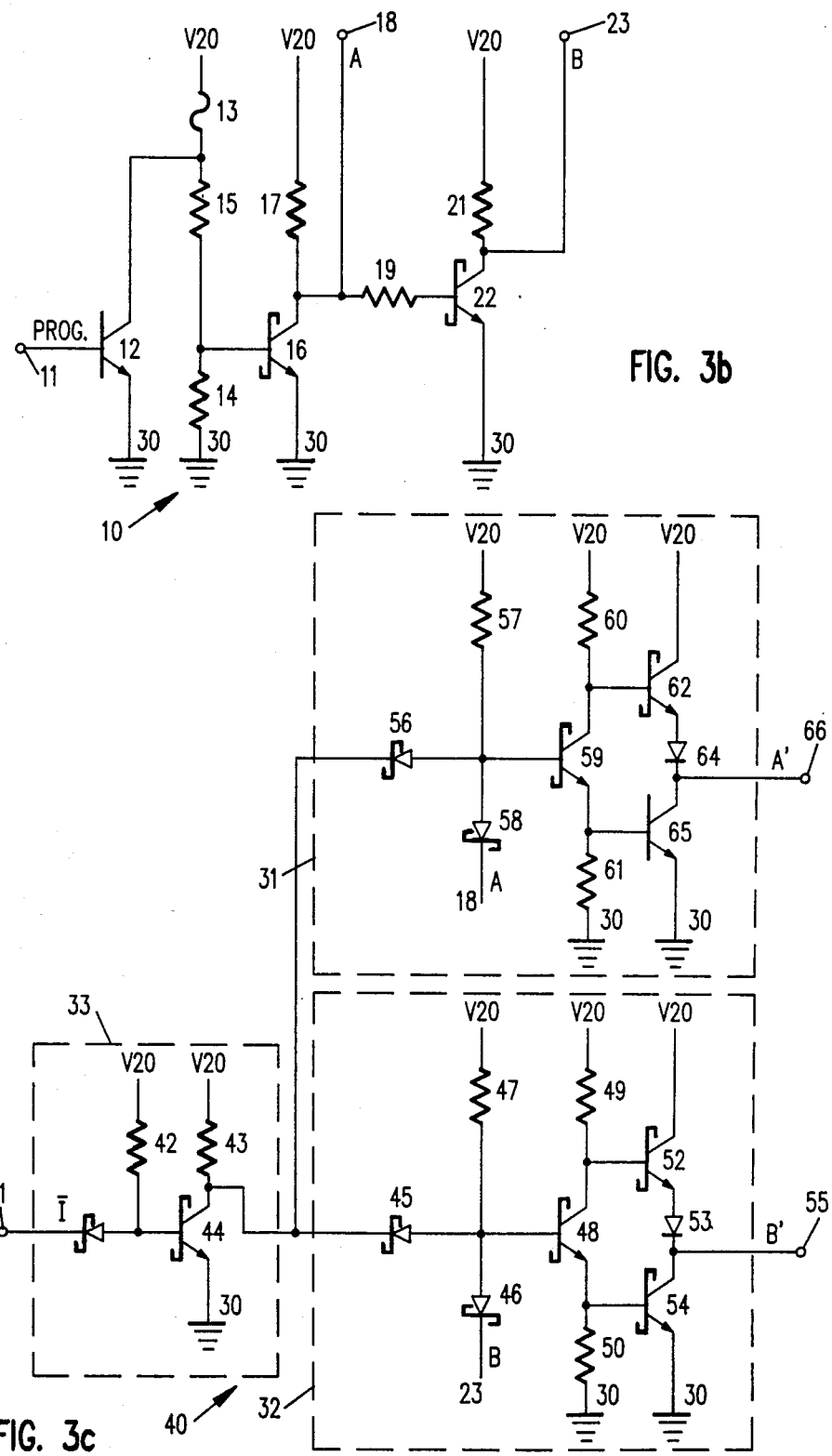
FIG. 3b is a schematic diagram of the programming portion of a circuit constructed in accordance with one embodiment of this invention; and, FIG. 3c is a schematic diagram of the initialization portion of a circuit constructed in accordance with one embodiment of this invention.

FIG. 3b shows one embodiment of programming circuit 10 which programs initialization circuit 40 to force master-slave flip-flop 70 to provide either a logical 1 output signal or a logical 0 output signal when a logical 0 initialize input signal $\bar{I}$ is received on input terminal 41. Programming circuit 10 of FIG. 3b is programmed by selectively opening fuse 13 or leaving it intact. Fuse 13 is opened by bringing programming input node 11 to a high voltage state (approximately 5 volts), thereby turning on transistor 12. Current flows from positive voltage source V20, through fuse 13, and transistor 12, thereby generating a current sufficient to open fuse 13.

When fuse 13 is open, transistor 16 is not forward biased and is thus off. Output signal A on terminal 18 is thus pulled to logical 1 level by positive voltage source V20 through resistor 17. When output signal A on terminal 18 is logical 1, transistor 22 is turned on and therefore causes output signal B on terminal 23 to be a logical 0. Conversely, when fuse 13 is intact, the base-emitter junction of transistor 16 is forward biased and therefore transistor 16 is on. When transistor 16 is on, the output signal A on terminal 18 is a logical 0. When transistor 16 is on, transistor 22 is not forward biased and is therefore off and output signal B on output terminal 23 is a logical 1.

One embodiment of initialization circuit 40 is shown in FIG. 3c. Initialization circuit 40 is placed in the initialization mode when a logical 0 initialization signal $\bar{I}$ is received on initialization input terminal 41. Initialization circuit 40 includes inverter 33, NAND gate 31, and NAND gate 32. During normal flip-flop operation, initialization input signal $\bar{I}$ is a logical 1. When a logical 1 signal is received on initialization input terminal 41, NPN transistor 44 is forward biased and is therefore on. When transistor 44 is on, the bases of NPN transistors 59 and 48 are both logical 0 and thus transistors 48 and 59 are off. When transistors 48 and 59 are off, there is no voltage drop across resistors 50 and 61, respectively. Therefore, transistors 54 and 65 are off. When transistors 48 and 59 are off, transistors 52 and 62 are on and thus output signals B' and A' on output terminals 55 and 66, respectively, are both logical 1. With output signals B' and A' on output terminals 55 and 66 are both logical 1, master-slave flip-flop circuit 70 (FIGS. 1, 3a) functions as a normal D-type master-slave flip-flop, as previously described.

Conversely, when initialization input signal $\bar{I}$ is a logical 0, output signal $D_{out}$ (FIG. 2) is immediately forced to a selected value which is stored in programming circuit 10. When initialization input signal $\bar{I}$ (FIG. 3c) is a logical 0, transistor 44 is off. When transistor 44 is off, diodes 56 and 45 are not forward biased, and therefore do not pull the bases of transistors 48 and 59, respectively, to logical 0. As explained earlier, either input signal A or B is a logical 0, depending on the programming of fuse 13 (FIG. 3b). When input signal A on input terminal 18 (FIG. 3c) is a logical 1 and input signal B on input terminal 23 is a logical 0, transistor 59 is forward biased by voltage supply V20 through resistors 57 and 61. The voltage drop across resistor 61 turns on transistor 65, thereby pulling output signal A' signal on output terminal 66 to a logical 0. The logical 0 input signal B on input terminal 23 pulls the base of transistor 48 to a low voltage level turning off transistor 48 and in turn, turning off transistor 54. With transistor 48 off, transistor 52 is on, and output signal B' on output terminal 55 is a logical 1.

When input signal A' applied to input terminal 66 of FIG. 3a is a logical 0 and input signal B' applied to input terminal 55 of FIG. 3a is a logical 1, the base of transistor 90 is pulled to a logical 0. Because the base of transistor 90 is a logical 0, transistors 90 and 93 are off. Therefore, current provided by positive voltage source V20 and resistor 98 turns on transistor 99 and output signal $D_{out}$ on output terminal 103 is a logical 0. The logical 0 input signal A' on input terminal 66 also turns on transistor 81 through emitter 81-3 and removes forward bias from transistor 80, thereby turning off transistor 80. Because transistors 93 and 80 are off, current flows from positive voltage source V20, through resistor 87, the base-collector junction of transistor 86, the base-emitter junction of transistor 85, and diode 84 to ground. Therefore, the base of transistor 90 is clamped to ground by transistor 85. Therefore, transistor 90 is off, and slave flip-flop 120 is forced by the logical 0 input signal A' on input terminal 66 to provide a logical 0 output $D_{out}$ signal on output terminal 103. This output signal $D_{out}$ on output terminal 103 is independent of the input signal D received on input terminal 71 and is independent of clock input signal CLK received on clock input terminal 77.

Conversely, when the initialization signal $\bar{I}$ is a logical 0 and input signal A received on input terminal 18 (FIG. 3c) is a logical 0 and input signal B received on input terminal 23 is a logical 1, output signal B' on output terminal 55 is a logical 0 and output signal A' on output terminal 66 is a logical 1. Because the input signal B' on input terminal 55 (FIG. 3a) is a logical 0, the base of transistor 85 is forced to a logical 0, thereby turning off transistor 85. Current flows from positive voltage source V20, through resistor 82, and base-emitter junction 78-3 of transistor 78, thereby turning off transistor 79. Because transistors 79 and 85 are off, current flows from positive voltage source V20, through resistor 88, the base-collector junction of transistor 89, the base-emitter junction of transistor 90, and resistor 92 and the base-emitter junction of transistor 93. Thus, transistors 90 and 93 are on and a logical 0 is provided to the base of transistor 99 thereby turning off transistor 99. Because transistor 99 is off, output signal $D_{out}$ on output terminal 103 is pulled to a logical 1 by positive voltage source V20 and resistor 100. Because transistor 93 is on, the base of transistor 85 is pulled to a logical 0 and therefore transistor 85 is off. Thus, slave flip-flop 120 provides a logical 1 output signal $D_{out}$ on output terminal 103. This logical 1 output signal $D_{out}$ is provided regardless of the status of input signal D on input terminal 71 and regardless of the status of clock input signal CLK on clock input terminal 77. Therefore, in accordance with the teachings of this invention, a register is provided which is capable of asynchronously forcing the output signal on its output terminal to a logical 1 or logical 0 as programmed by the initialization circuitry.

While this specification illustrates specific embodiments of this invention, it is not to be interpreted as limiting the scope of the invention. Many embodiments of this invention will become evident to those of ordinary skill in the art in light of the teachings of this specification.

We claim:

1. An N bit register comprising a multiplicity of bit registers, each bit register comprising:
   an initialization means, a programming means and a data storage means, wherein said programming means comprises a programming input terminal for receiving a programming input signal, and a programming output port for providing a programming output signal;
   means for applying said programming output signal to an input terminal of said initialization means, said initialization means having an initialization output port for providing an initialization output signal having a Set or Reset function dependent upon the programming output signal;
   means for applying an initialization input signal simultaneously to each initialization means of said N bit register;
   means for applying said initialization output signal to a first input terminal of said data storage means;
   means for applying a data input signal to a second input terminal of said data storage means;
   means for applying a clock input signal to a third input terminal of said data storage means; and
   means for providing a data output signal from said data storage means, said data output signal being responsive to the presence of an initialization input signal whereby the status of the programming means is defined independently of the status of the clock input signal or the status of the data input signal in the presence of the initialization input signal.

2. An N bit register as in claim 1, wherein each of said programming means of said N bit register comprises a programming element having a low impedance state and a high impedance state, wherein said programming means is in a first state when a low impedance is provided and in a second state when a high impedance is provided, and wherein each programming element is a fuse.

3. An N bit register as in claim 1 wherein each said programming means comprises:
   a programming element having a low impedance state and a high impedance state, wherein said programming means is in said first state when a low impedance is provided and said programming means is in said second state when a high impedance is provided.

4. An N bit register as in claim 1 where each said data storage means comprises:

a flip-flop having an input lead serving as said data input lead, an output lead serving as said output lead of said data storage means, a clock input lead serving as said clock input lead of said data storage means, and an initialization input lead serving as said initialization input lead of said data storage means.

5. A single bit register having a data input terminal, an initialization input terminal, and a data output terminal, comprising:

data storage means having a data input lead connected to said data input terminal, a data output lead connected to said data output terminal, a clock input lead coupled to the input lead of said data storage means, and an initialization input port, wherein, in the absence of an initialization signal on said initialization input port, said data storage means stores a bit received on said data input lead in response to a clock signal received on said clock input lead and provides said stored bit on said output lead, and wherein, in response to an initialization signal provided on said initialization input port, said data storage means stores a preselected bit and provides said preselected bit on said data output lead regardless of the presence of said clock signal;

programming means having a programming output lead wherein said programming output lead provides a programming output signal defining the state of said preselected bit; and initialization means coupled to the output lead of said programming means and having an output port connected to said initialization input port of said data storage means, an initialization input lead connected to said initialization input terminal, wherein in response to a first initialization signal received on said initialization input terminal, said initialization means provides a second initialization signal on said output port of said initialization means which causes said data storage means to store said preselected bit, said second initialization signal defining the state of said preselected bit in response to the signal received from said programming means.

6. A register as in claim 5 wherein said programming means comprises:

a programming element having a low impedance state and a high impedance state wherein said programming means is in a first state when a low impedance is provided and said programming means is in a second state when a high impedance is provided by said element.

7. A register as in claim 5 wherein said data storage means comprise:

a flip-flop having an input lead serving as said data input lead, an output lead serving as said output lead of said data storage means, a clock input lead serving as said clock input lead of said data storage means, and an initialization port serving as said initialization input port of said data storage means.

8. A master-slave flip flop having first initialization input terminal for receiving a first initialization input signal, a second initialization input terminal for receiving a second initialization input signal, a data input terminal for receiving a first data input signal, a clock input terminal for receiving a clock input signal and a data output terminal for providing a data output signal, comprising:

first means for storing a first data bit having an output port for providing a first data output signal wherein, when said first and second initialization input signals are a first set of values, and said clock input signal is a first value, said first data bit output signal is equivalent to said data input signal, wherein, when said first and second initialization input signals are a second set of values, said first data bit output signal is a second value, and wherein, when said first and second initialization input signals are a third set of values, said first data bit output signal is a third value; and second means for storing a second data bit having an input port for receiving a second data input signal connected to said output port of said first means for storing and an output lead connected to said data output terminal wherein, when said first and second initialization input signals are said first set of values, said data output signal is equivalent to said second data input signal, wherein, when said first and second initialization input signals are said second set of values, said second data input signal is said second value, and wherein, when said first and second initialization input signals are said third set of values, said second data input signal is said third value.

9. A circuit for generating first and second initialization output signals capable of providing three sets of signals having a first initialization output terminal for providing a first initialization output signal, a second initialization output terminal for providing a second initialization output signal, a initialization input terminal for receiving an initialization input signal, and a program input terminal for receiving a program input signal, comprising:

a first NAND gate having a first input lead, a second input lead connected to said initialization input terminal, and an output lead connected to said first initialization output terminal;

a second NAND gate having a first input lead, a second input lead connected to said initialization input terminal, and an output lead connected to said second intialization output terminal; and complementary input means having an input lead connected to said program input terminal, a noninverting output terminal connected to said first input lead of said first NAND gate, and an inverting input lead connected to said first input lead of said second NAND gate wherein, when said initialization input signal is a first initialization value, said first initialization output signal is a first output value and said second initialization output signal is a first output value, wherein, when said initialization input signal is a second initialization value and said program input signal is a first program value, said first initialization output signal is said first output value and said second initialization output signal is a second output value, and wherein, when said initialization input signal is a second initialization value and said program input signal is a second program value, said first initialization output signal is said second output value and said second initialization output signal is said first output value.

10. A programmable asynchronous register initialization circuit comprising:

a bistable multivibrator for storing data and for providing an output data signal;

means for applying a data input signal to said multivibrator;

means for applying a clock input signal to said multivibrator;

an initialization circuit coupled to the input circuit of said multivibrator for receiving a binary data initialization signal and for providing initialization output signals to said multivibrator;

a programming circuit for receiving a programming input signal and for providing complementary output signals to said initialization circuit;

so that said multivibrator functions as a normal D-type flip-flop in response to the clock input signal when said initialization output signals are both of the same binary value, and when the initialization signals are of a different binary value, the output data signal from said multivibrator is forced to a given binary value independent of the status of said clock input signal.

11. A single bit register having a data input terminal, an initialization input terminal, and a data output terminal, comprising:

data storage means having a data input lead connected to said data input terminal, a data output lead connected to said data output terminal, a clock input lead coupled to the input lead of said data storage means, and an initialization input port, wherein, in the absence of an initialization signal on said initialization input port, said data storage means stores a bit received on said data input lead in response to a clock signal received on said clock input lead and provides said stored bit on said output lead, and wherein, in response to an initialization signal provided on said initialization input port, said data storage means stores a preselected bit and provides said preselected bit on said data output lead regardless of the presence of said clock signal;

a programming circuit having a programming output lead wherein said programming output lead provides a programming output signal defining the state of said preselected bit;

initialization means coupled to the output lead of said programming circuit and having an output port connected to said initialization input port of said data storage means, an initialization input lead connected to said initialization input terminal, wherein in response to a first initialization signal received on said initialization input terminal, said initialization means provides a second initialization signal on said output port of said initialization means which causes said data storage means to store said preselected bit, said second initialization signal defining the state of said preselected bit in response to the signal received from said programming circuit;

wherein said programming circuit comprises:

a programming element having a low impedance state and a high impedance state wherein said programming circuit is in a first state when a low impedance is provided and said programming circuit is in a second state when a high impedance is provided by said element; and wherein said programming element is a fuse.

12. An N bit register comprising a multiplicity of bit registers, each bit register comprising:

an initialization means, a programming circuit and a data storage means, wherein said programming circuit comprises a programming input terminal for receiving a programming input signal and a programming output port for providing a programming output signal;

means for applying said programming output signal to an input terminal of said initialization means, said initialization means having an initialization output port for providing an initialization output signal having a Set or Reset function dependent upon the programming output signal;

means for applying an initialization input signal simultaneously to each initialization means of said N bit register;

means for applying said initialization output signal to a first input terminal of said data storage means;

means for applying a data input signal to a second input terminal of said data storage means;

means for applying a clock input signal to a third input terminal of said data storage means; - means for providing a data output signal from said data storage means, said data output signal being responsive to the presence of an initialization input signal whereby the status of the programming circuit is defined independently of the status of the clock input signal or the status of the data input signal in the presence of the initialization input signal;

wherein each said programming circuit comprises:

a programming element having a low impedance state and a high impedance state, wherein said programming circuit is in said first state when a low impedance is provided and said programming circuit is in said second state when a high impedance is provided; and wherein each said programming element is a fuse.

* * * * *